(12) United States Patent
Lu et al.

(10) Patent No.: US 12,249,985 B2
(45) Date of Patent: Mar. 11, 2025

(54) VOLTAGE COMPARATOR CIRCUIT FOR USE WITH AN ENERGY HARVESTER

(71) Applicant: Logistics and Supply Chain MultiTech R&D Centre Limited, Hong Kong (HK)

(72) Inventors: Feng Lu, Hong Kong (HK); Jing Jung Tang, Hong Kong (HK)

( * ) Notice: Subject to any disclaimer, the term of this patent is extended or adjusted under 35 U.S.C. 154(b) by 207 days.

(21) Appl. No.: 18/184,941

(22) Filed: Mar. 16, 2023

(65) Prior Publication Data

US 2024/0313778 A1   Sep. 19, 2024

(51) Int. Cl.
| H03K 19/0185 | (2006.01) |
| H03K 3/356 | (2006.01) |
| H03K 17/10 | (2006.01) |

(52) U.S. Cl.
CPC ............... *H03K 19/018521* (2013.01); *H03K 3/356104* (2013.01); *H03K 17/102* (2013.01)

(58) Field of Classification Search
None
See application file for complete search history.

(56) References Cited

U.S. PATENT DOCUMENTS

| 8,493,096 | B1* | 7/2013 | Buescher | ................ | H03K 5/24 327/63 |
| 10,044,218 | B2* | 8/2018 | Tiefnig | .................... | H02J 7/35 |
| 2013/0088262 | A1* | 4/2013 | Pun | ......................... | H03K 5/22 327/65 |
| 2023/0344270 | A1* | 10/2023 | van der Velden | ...... | H02M 1/10 |

\* cited by examiner

*Primary Examiner* — Jany Richardson
(74) *Attorney, Agent, or Firm* — KPIP Law PLLC; Kimberly A Peaslee

(57) ABSTRACT

A voltage comparator circuit for a power source having an energy harvester and an energy storage. The circuit comprises a first voltage input node and a second voltage input node arranged to respectively receive a first voltage level of a first output of the energy harvester and a voltage level of a second output of the energy storage; an output node arranged to switch in response to a comparison of the first and second first voltage levels; and a plurality of semiconductor junction devices arranged to provide a floating local ground arranged to vary in response to a change of the first and/or the second voltage level, wherein the floating local ground has a voltage level higher than an absolute ground connected to the voltage comparator circuit; wherein the floating local ground is arranged to prevent a breakdown of circuit components due to a voltage difference connected at terminals of each of the circuit component exceeding a breakdown voltage of the respective circuit component.

20 Claims, 3 Drawing Sheets

VOLTAGE COMPARATOR CIRCUIT FOR USE WITH AN ENERGY HARVESTER

TECHNICAL FIELD

The present invention relates to a voltage comparator circuit, although not exclusively, to a voltage comparator circuit for use with an energy harvester and an energy storage device.

BACKGROUND

Electrical loads, such as microsystems, consume electrical power during operation, thus it is necessary to include an energy storage device with certain power capacity to support a prolong period of continuous or continual operation before recharging.

An increasingly practicable possibility for overcoming the limitations of batteries as a power source is to extract/harvest ambient energy to either recharge them, or even to directly power the specific electrical loads. Energy harvesting has therefore become an attractive proposition for powering a wide variety of autonomous microsystems such as wireless health monitoring sensors, biomedical implants, monitoring devices for harsh condition, structure-embedded instrumentation, remote control, and electronic devices such as portable calculators, watches, and Bluetooth headsets.

SUMMARY OF THE INVENTION

In accordance with a first aspect of the present invention, there is provided a voltage comparator circuit for a power source having an energy harvester and an energy storage, comprising: a first voltage input node and a second voltage input node arranged to respectively receive a first voltage level, VDD1, of a first output of the energy harvester and a voltage level, VDD2, of a second output of the energy storage; an output node, Y, arranged to switch in response to a comparison of VDD1 and VDD2; and a plurality of semiconductor junction devices arranged to provide an adjustable floating ground (AFG), VSS_LOCAL, arranged to vary in response to a change of the VDD1 and/or VDD2, wherein VSS_LOCAL has a voltage level higher than an absolute ground, GND, connected to the voltage comparator circuit; wherein the adjustable floating ground, VSS_LOCAL, is arranged to prevent a breakdown of circuit components due to a voltage difference connected at terminals of each of the circuit component exceeding a breakdown voltage, Vmax, of the respective circuit component.

In accordance with the first aspect, VDD2 is lower than or equals to twice of Vmax.

In accordance with the first aspect, the plurality of semiconductor junction devices comprises a first set, a second set, a third set and a fourth set of junction devices, each of the junction devices has a forward bias voltage drop of a predetermined voltage potential, and wherein VSS_LOCAL is at a node where the first set of junction devices is connected to the fourth set of junction devices.

In accordance with the first aspect, the first of junction devices includes m of junction devices, the second of junction devices includes n of junction devices, the third of junction devices includes p of junction devices, the fourth of junction devices includes q of junction devices.

In accordance with the first aspect, the circuit further comprises a switch S1 arranged to create a bypass the third of junction devices based on the voltage level of VDD1.

In accordance with the first aspect, when VDD1 is high, the switch S1 is closed, a continuous current path is provided from VDD1 to GND, passing through sequentially the first set of junction devices, VSS_LOCAL and the fourth set of junction devices.

In accordance with the first aspect, the circuit further comprises a first capacitor C1 connected between GND and VSS_LOCAL, wherein the first capacitor C1 is arranged to stabilize VSS_LOCAL.

In accordance with the first aspect, the circuit further comprises a voltage limiting diode connected between VDD2 and VSS_LOCAL arranged to limit a voltage difference between VSS_LOCAL and VDD2.

In accordance with the first aspect, the circuit further comprises a second capacitor arranged to pull down the output node Y during the rising edge of VDD1.

In accordance with the first aspect, the second capacitor is a capacitor C2 arranged to speed up the turnoff of one or more pull down transistor switches in a current source and mirror stage connected in series with VSS_LOCAL.

In accordance with the first aspect, the circuit further comprises a VDD-enabling PMOS arranged to connect VDD_LOCAL to VDD1 when VDD1 is high.

In accordance with the first aspect, the circuit further comprises a switch S2 to isolate VDD1 from the Low power voltage comparator when VDD1 is low.

In accordance with the first aspect, the pull up circuit comprises a plurality of PMOS connected in series between output node Y and VDD2, and a plurality of capacitors each connected to a gate of the respective PMOS.

In accordance with the first aspect, the fourth capacitor is a capacitor C4 arranged to decouple a pull up circuit connected in series with VDD2 which are configured to pull up the output node Y when VDD1 is falling down.

In accordance with the first aspect, when VDD1 is low, a continuous current path is provided from VDD2 to GND, passing through sequentially the first set of junction devices, VSS_LOCAL, the third set of junction devices, and the fourth set of junction devices.

In accordance with the first aspect, the energy storage is further arranged to energize the voltage comparator circuit.

BRIEF DESCRIPTION OF THE DRAWINGS

Embodiments of the present invention will now be described, by way of example, with reference to the accompanying drawings in which.

DETAILED DESCRIPTION OF THE PREFERRED EMBODIMENTS

The inventors devised that ambient energy may be available in form of, light, motion, electromagnetic (EM) waves/radio frequency (RF) power or heat. These different forms of ambient energy may be harvested by suitable energy harvesters, for example, for light energy harvesting, photovoltaic/solar cells may be used to convert light or solar energy to electricity; for vibration energy harvesting, motion sensors or transducers may be used to convert mechanical energy to electricity; for heat or thermal energy harvesting, heat may be transformed to electrical energy using thermoelectric generator or electricity via mechanical energy generated by heat; and for EM waves or RF power harvesting, EM waves or RF power may be collected, for example by antennas, then stored in capacitors or batteries after appropriate conversions by power electronic circuits.

Figure 1:
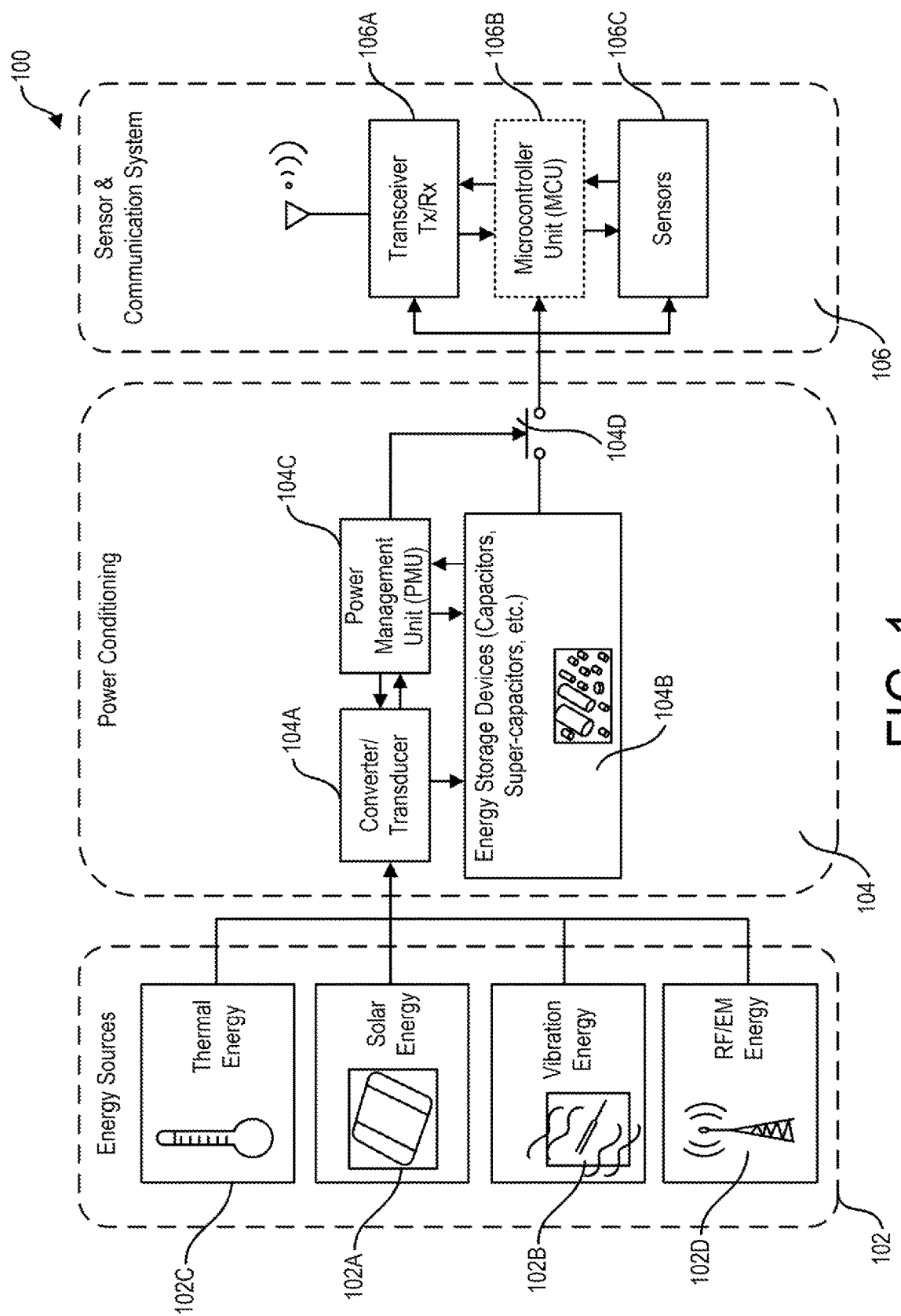
FIG. 1 is a block diagram showing of an example arrangement and operation of an electrical apparatus incorporating a power conditioning circuit comprising the voltage comparator in accordance with an embodiment of the present invention.

With reference to FIG. 1, there is shown a system 100 comprising and energy source 102, a power conditioning stage 104 and a sensor and communication system 106. In this example, the devices which convert ambient energies to electrical energies may be called converters, transducers or energy harvesters 104A. On the other hand, the devices which store the converted electrical energies may be called energy storage devices 104B, such as but not limited to batteries, capacitors, super capacitors, etc.

Without wishing to be bound by theory, a characteristic of ambient energies is that their availability may be intermediate. Sometimes when ambient energy, such as solar power 102A, is available, an energy harvester 104A such as a photovoltaic cell may provide a power output which can be used to charge an energy storage device 104B (e.g. a rechargeable lithium-ion battery), then the charging switch should be closed, so that electrical current may be drawn from the photovoltaic cell to the rechargeable lithium-ion battery to recharge the energy storage device 104B. In this condition, the operation voltage of the photovoltaic cell under sunlight is considered as logically "high", as appreciated by a skilled person in the art that it should be at a level approaching the open-circuit voltage (Voc) of the photovoltaic cell.

Sometimes when ambient energy is not available, the energy harvester 104A should not be delivering or generating a power output, then the charging switch should be opened. For example, when solar power is not available, the operating voltage of a photovoltaic cell may be zero or very close to zero, and there is no or only a negligible amount of electric current being drawn from the photovoltaic cell which may be insufficient to charge the rechargeable lithium-ion battery. In this condition, the operation voltage of the photovoltaic cell under sunlight is considered as logically "low".

Taking an example of a motion sensor, when ambient energy is available, the transducer produces a logically high signal which indicate mechanical energy 102B is present and electricity may be harvested, or in a thermal energy harvesting system, such as a thermoelectric generator (TEG) based harvester, the output is high if a sufficiently large thermal gradient 102C on opposite sides of the TEG is present. For antennas, an RF circuit may be excited by the EM waves or RF power 102D which produce a high amplitude/signal. It is appreciated by a skilled person that when ambient energy is not available, the energy harvesters 104A of these examples stay low or remains idle, which indicates no electrical power output is produced or ambient energy is not available or insufficient.

The inventors devised that passive electronic components such as diodes or diode-like devices may be used to charge the energy storage devices with the transduced energies, but diodes or diode-like devices, during operation, produce significant forward voltage drop, and the reverse-bias current leakage is also not desired for an energy harvesting circuit since the limited electrical power stored by the power module in the circuit is precious.

Alternatively, a voltage comparator may be used to control a charging switch is an effective way to reduce unnecessary wastage of harvested energy in the passive components, however the design of the voltage comparator is challenging. In an example embodiment of the present invention, a voltage comparator is provided, which compares the voltage of the transducer output (hereinafter referred as VDD1) and the voltage of the energy storage device (hereinafter referred as VDD2) and uses the result to control a charging switch.

In this example, the voltage comparator may be implemented as a portion of a power management unit 104C, thereby combining with the energy harvester 104A and the energy storage device 104B to form a power conditioning stage 104 or an intelligent power module which may self-conditioned to harvest ambient energy, to recharge the energy storage devices, and to selectively (i.e. via an output switch 104D) power the loads such as the transceiver 106A, the microcontroller unit 106B and various sensors 106C to provide different functions of an electronic apparatus or device.

In this invention, two non-restrictive example embodiments of voltage comparator circuits are described, in which both embodiments may preferably comprise a low power voltage comparator circuit electrically coupled to an adjustable floating ground generator circuit. It should be appreciated by a skilled person in the art that, whilst circuits in this product may be illustrated or described as a unitary circuit with reference to the accompanying drawings, portions of the circuit or certain components in the circuit may be replaced by alternative components or modules with similar functions without deviating from the spirit of the invention.

Figure 2:
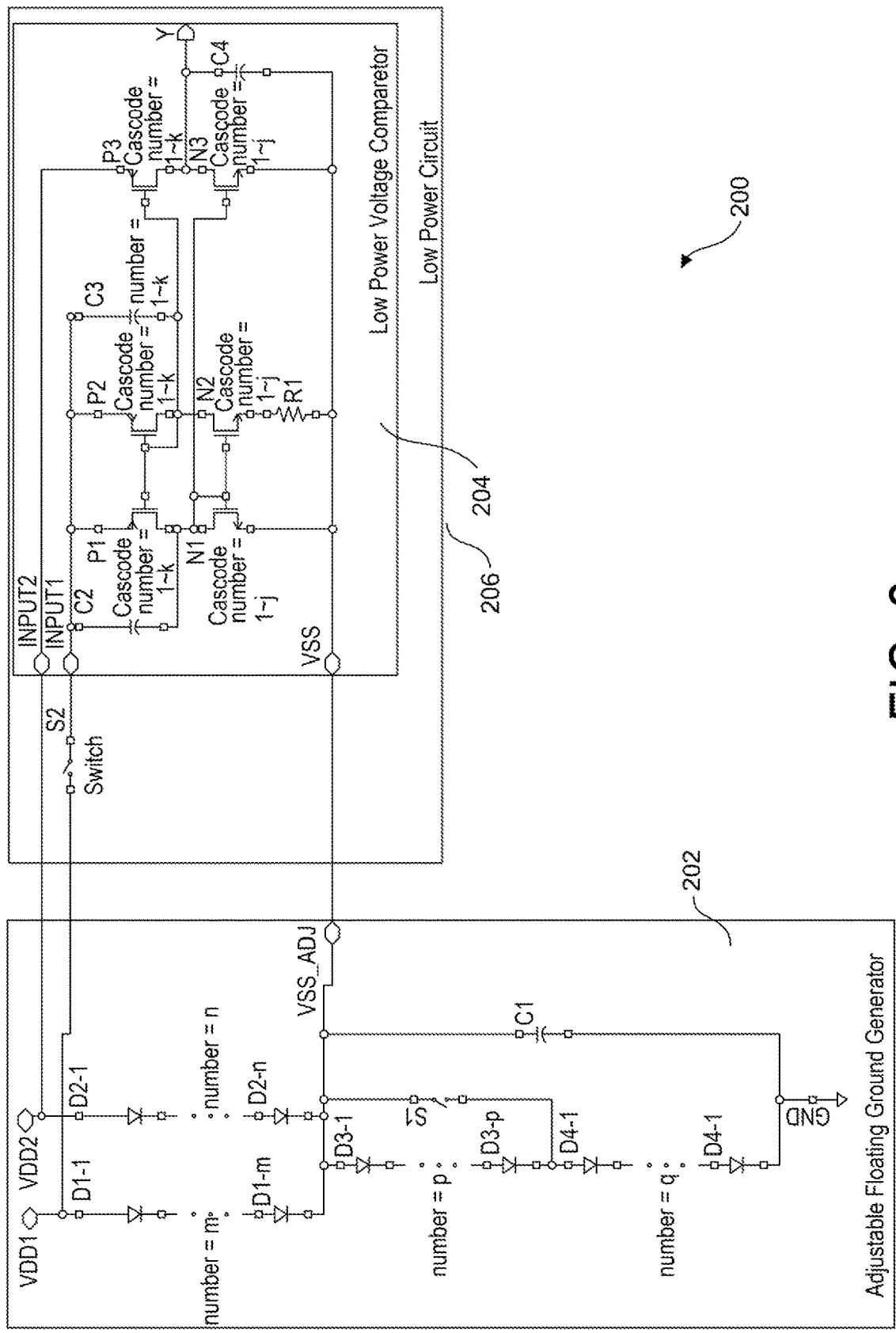
FIG. 2 is a schematic diagram showing a voltage comparator in accordance with an embodiment of the present invention.

With reference to FIG. 2, there is provided an embodiment of a voltage comparator circuit 200 for a power source having an energy harvester and an energy storage, such as the energy harvester 104A and energy storage 104B, comprising: a first voltage input node and a second voltage input node arranged to respectively receive a first voltage level, VDD1, of a first output of the energy harvester and a voltage level, VDD2, of a second output of the energy storage; an output node, Y, arranged to switch in response to a comparison of VDD1 and VDD2; and a plurality of semiconductor junction devices arranged to provide an adjustable floating ground, VSS_LOCAL, arranged to vary in response to a change of the VDD1 and/or VDD2, wherein VSS_LOCAL has a voltage level higher than an absolute ground, GND, connected to the voltage comparator circuit; wherein the floating local ground, VSS_LOCAL, is arranged to prevent a breakdown of circuit components due to a voltage difference connected at terminals of each of the circuit component exceeding a breakdown voltage, Vmax, of the respective circuit component.

The inventors further devised that a voltage comparator 200 should have the following characteristics: 1. when either VDD1 or VDD2 is very low, even equals to zero, or both VDD1 and VDD2 are very low, even equal to zero, it could still provide correct output, which should be as same as the output when both VDD1 and VDD2 are high enough; 2. when VDD1 is zero, and VDD2 is not, the voltage comparator 200 should draw extremely small current from the energy storage device, so that it can store the charge for extremely long time; and 3. since the ambient energies often change their status in short time, e.g., the ambient RF signal may be on and off with a few millisecond durations, the voltage comparator 200 should switch its output with a much shorter rising/falling edge.

In addition, integrated circuit (IC) devices, such as diodes and semiconductor switches/transistors, have a certain breakdown voltage (Vmax), once the voltage between certain two nodes of a device exceed Vmax, it will be damaged. Thus, it is necessary to ensures that the potential different across any two terminals/nodes of each of the devices in the circuit does not exceed Vmax of that particular device.

For example, a typical break down voltage for 1.2V MOSFETs is about 1.5V, and a typical break down voltage for 2.5V MOSFETs is about 3V, however, the energy storage devices are capable to store energy with much higher voltage, for example, the nominal operation voltage of a lithium-ion battery is around 3.6-3.7 V, and some time may be even higher when the battery has been fully charged or multiple battery cells are connected in series in a power module in some example devices. This means if the energy storage devices store as much energy as they could, their terminal voltage is very likely to exceed Vmax of the devices in the power management unit, taking a risk to damage the circuits.

Preferably, an adjustable floating ground is provided in the voltage comparator 200 circuit to make sure all devices in it will not exceed their Vmax, meanwhile, it allows the energy storage devices to have terminal voltage almost as high as twice of Vmax, i.e. VDD2 is lower than or equals to twice of Vmax. For example, components in the low power voltage comparator circuit 204 may be protected from breaking down, by connecting the low power voltage comparator circuit 204 to the adjustable floating ground instead of an absolute ground. For simplicity, the components not being a part of the low power voltage comparator circuit 204 can be considered as forming the adjustable floating ground generator circuit as described earlier.

With reference to FIG. 2, the plurality of semiconductor junction devices provides the floating local ground, VSS_LOCAL, which is at a voltage level higher than the absolute ground or absolute VSS, i.e. the most negative voltage potential of the overall circuit. For simplicity, the absolute ground, GND, in this example is zero volt. In this example, the low power voltage comparator 204 is connected or disconnected to VDD1 depending on voltage level of VDD1, with a switch S1 controlled by VDD1.

It should be appreciated by a skilled person that the current source and mirror portion in the low voltage comparator 204 may be either simplified or made more complicated, to be similar current source and current mirror, and the other part of the circuit just need to be adjusted slightly accordingly.

In the voltage comparator 204, N1, N2, N3 may be modified to be 3 groups of cascaded NMOSFETs, each group has the same j class, and the 3 gates in a same class should be connected. P1, P2, P3 may be modified to be 3 groups of cascaded PMOSFETs, each group has the same k class, and the 3 gates in a same class should be connected. If P1, P2, P3 are to be k-class cascaded PMOSFETs, C2 should be modified to paralleled capacitors with the same number k, and each of these capacitors should be connected to the gate of one class of the PMOSFETs.

The circuit also comprises a number of passive components, such as capacitors which may function to switch on/off a gate of a transistor so as to pull up/down a potential level of a node/terminal, and/or to stabilize a voltage level of certain node. For example, a pull up circuit may be incorporated, which comprises a plurality of PMOS connected in series between output node Y and VDD2, and a plurality of capacitors each connected to a gate of the respective PMOS.

Preferably, the energy storage is further arranged to energize the voltage comparator 200 circuit. Referring to FIG. 2, the plurality of PMOS P3 may use VDD2 as both power source and input, and have no minimum voltage requirement for VDD2. Preferably, VDD2 could be very low, even equals to zero. Advantageously, even a device employing so power module runs out of battery, the circuit is still operable once ambient energy is available.

In one example operation, during and right after the falling edge of VDD1, i.e. when the energy harvester starts receiving no ambient energy which causes the output of the energy harvester to drop from high to low, the capacitor or paralleled capacitors C3 ensure the gate/gates of the PMOS or cascaded PMOS P3 to be tied to low voltage for a while, allowing the output signal Y to be pulled up rapidly, which in turns switch off the charging circuit and/or the electric load.

In contrast, during and right after the rising edge of VDD1, i.e. when the energy harvester starts receiving ambient energy which causes the output of the energy harvester to rise from low to high, the capacitors C2 ensures the gate/gates of the NMOS or cascaded NMOS N3 to be tied to high for a while, allowing the output signal Y to be pulled down rapidly, which in turns switch on the charging circuit and/or the electric load. In this configuration the capacitor C2 is arranged to pull down the output node Y during the rising edge of VDD1, by turning on one or more pull down transistor switches in the current source and mirror stage in 204 connected in series with VSS_LOCAL.

In addition, a capacitor C4 is included to decouple a pull up circuit connected in series with VDD2 which are configured to pull up the output node Y when VDD1 is low. For example, during the rising edge of VDD1, the capacitor C4 helps to reduce the coupling between the output Y and some rising nodes such as gate/gates of the PMOS or cascaded PMOS P3.

Preferably, the voltage comparator 200 comprises a plurality of semiconductor junction devices, forming four groups of junction devices such as diodes, located along different current paths connecting the high potential node(s) to the low potential nodes, especially the absolute ground GND, in which the adjustable floating ground VSS_LOCAL is located along these current paths and thus the voltage level of VSS_LOCAL is at a middle potential between a high potential node, usually VDD1 or VDD2, and the low potential node GND.

Alternatively, VSS_LOCAL pulling diodes can be instead replaced by devices with similar electrical characteristics such as diode-connected MOSFETS.

In this example, the voltage comparator 200 comprises four sets of junction devices, each of the junction devices has a forward bias voltage drop of a predetermined voltage potential, and wherein VSS_LOCAL is at a node where the first set of junction devices is connected to the second, third and fourth set of junction devices. In addition, a switch is included to create a bypass from the third set of junctions based on the voltage level of VDD1.

When VDD1 is high, as shown in FIG. 2, a continuous current path is provided from VDD1 to GND, passing through sequentially the first set of junction devices, VSS_LOCAL and the fourth set of junction devices. In this condition, the third set of junctions is bypassed by the NMOS N10, then the cascaded first and fourth set of junctions ensure the adjustable floating ground VSS_LOCAL neither too low nor too high, so that the devices between VDD1 and VSS_LOCAL or between VDD2 and VSS_LOCAL will not break down.

In this example, the first set of junction devices includes m diodes, and the fourth set of junction devices includes q diodes, i.e., the number of the cascaded diodes for VSS_LOCAL pulling is m+q. The number of diodes could be adjusted according to threshold of the diodes, the breakdown voltage of the devices, and the targeted power consumption.

In addition, electric charges are stored on the capacitor C1 to stabilize the voltage of adjustable floating ground VSS_LOCAL. Referring to FIG. 2, the capacitor C1 is connected between GND and VSS_LOCAL, wherein the first capacitor C1 is arranged to stabilize VSS_LOCAL. When C1 is large enough, VSS_LOCAL is not likely to be too high.

Alternatively, or optionally, the voltage comparator 200 may further comprises a voltage limiting diode connected between VDD2 and VSS_LOCAL arranged to limit a voltage difference between VSS_LOCAL and VDD2. In this case, if C1 could not be large enough for some reason and VSS_LOCAL is too high, the diode D15 will limit the voltage difference between VSS_LOCAL and VDD2.

In contrast, when VDD1 is low, the cascaded second, third and fourth set of junction devices ensure the adjustable floating ground VSS_LOCAL neither too low nor too high, so that the devices between VDD1 and VSS_LOCAL or between VDD2 and VSS_LOCAL will not break down. Similarly, a continuous current path is provided from VDD2 to GND, passing through sequentially the first set of junction devices, VSS_LOCAL and the third and fourth set of junction devices, the number of diodes could be adjusted according to threshold of the diodes, the breakdown voltage of the devices, and the targeted power consumption.

In addition, referring to FIG. 2, the voltage comparator 200 further comprises a switch S1 arranged to connect the low voltage comparator to VDD1 when VDD1 is high, and isolate the low voltage comparator from VDD1 when VDD1 is low.

Figure 3:
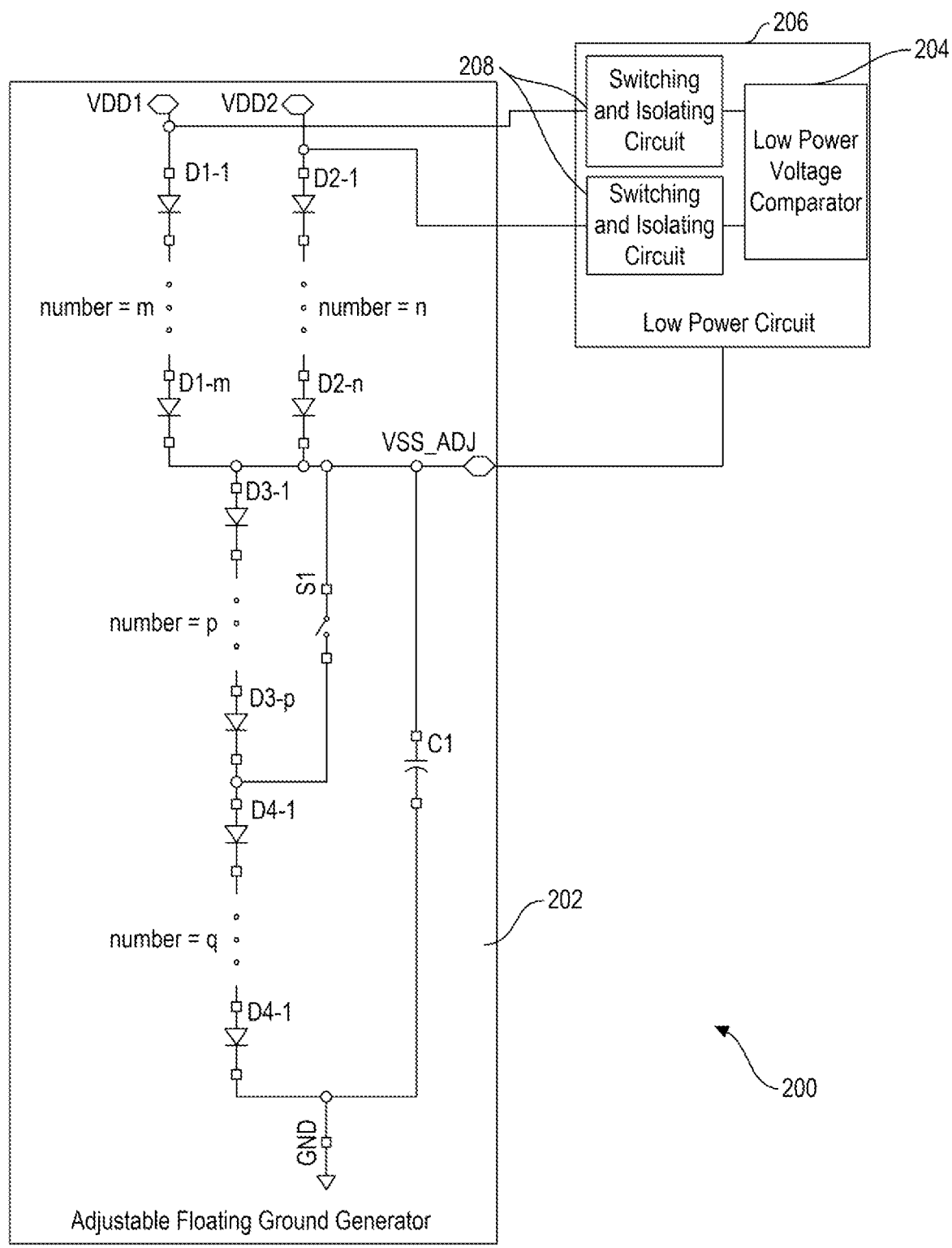
FIG. 3 is a schematic diagram showing the voltage comparator in accordance with the embodiment in FIG. 2.

The quantity of cascaded diodes and their functions, and method of Adjustable floating ground generation is further described as follows:

Referring to FIG. 3, the quantity of cascaded diodes is defined as:
a) Group one D1-1~D1-m, the quantity is m
b) Group two D2-1~D2-n, the quantity is n
c) Group three D3-1~D3-p, the quantity is p
d) Group four D4-1~D4-q, the quantity is q If n is larger than m (or vice versa), the operations of the AFG may be:

Case 1: If the voltage of VDD1 is not lower than VDD2, the current passing through the group two diodes is neglectable comparing to that passing through the group one. Assuming the low power circuit 306 consumes very small power, so the current passing through it is neglectable. Under these conditions, if the switch S1 is closed, the third group diodes is bypassed, then after stabilized, the voltage of the Adjustable floating ground (node name VSS_ADJ) is approximately determined by the equation $$Vvss\_adj = q/(m+q) * V1$$

where V1 is the voltage of VDD1.

Case 2: When the voltage of VDD1 is low enough comparing to the voltage of VDD2, the current passing through the group one diodes is neglectable comparing to that passing through the group two. Assuming the low power circuit 306 consumes very small power, or is even shut down, the current passing through it is neglectable. Under these conditions, if the switch S1 is open, after stabilized, the voltage of the Adjustable floating ground (node name VSS_ADJ) is approximately determined by the equation $$Vvss\_adj = (p+q)/(n+p+q) * V2$$

where V2 is the voltage of VDD2.

In Case 2, for a certain voltage of VDD2, if the value n+p+q is properly determined, the current passing through the group two, group three and group four diodes can be ultra small, consuming ultra low power.

In certain scenarios, it may be preferable that the voltage of the Adjustable floating ground does not follow these equations. For example, in an alternative example, the capacitance of C1 may be very large, or it is possible to limit the voltage difference of the Adjustable floating ground and VDD2 by a diode.

With reference to FIGS. 3, there is provided an alternative embodiment of the present invention. In this example, the circuit comprises two main components, including an adjustable floating ground generator circuit 202 and a low power circuit 206, as shown in the circuit diagram in FIG. 3. In addition, low power voltage comparator circuit 204 may be combined with one or more switches, or a switching and isolating circuit 208, to form a lower power circuit 206.

The functions of Switching and Isolating Circuit (SIC) 208 in the low power circuit 206 may operate as follows.

When the switch in the SIC 208 is closed, VDD1 and/or VDD2 could be connected to the other part of the low power circuit as both signal and power supply.

If voltage of VDD1<voltage of VSS_ADJ<voltage of VDD2, the switch in the SIC connected to VDD1 is open, the first function is to block the path through which the charge passes from node VDD2 and/or node VSS_ADJ to VDD1, the second function is it could undertake proper voltage difference so that to isolate VDD1 voltage when it's extremely low, protecting the other part of the low power circuit 206 from be damaged.

If voltage of VDD2<voltage of VSS_ADJ<voltage of VDD1, the switch in the SIC connected to VDD2 is open, the first function is to block the path through which the charge passes from node VDD1 and/or node VSS_ADJ to VDD2, the second function is it could undertake proper voltage difference so that to isolate VDD2 voltage when it's extremely low, protecting the other part of the low power circuit 206 from be damaged.

Advantageously, the capacitor C1 stables and buffers the voltage of the Adjustable floating ground (AFG), and the current flows from the low power circuit 206 to the Adjustable floating ground (AFG) can influent the voltage of this node, thus the current must be small enough in order not to influent it too much.

Hence, referring back to FIG. 3, when the two circuits, i.e. the adjustable floating ground generator circuit 202 and a low power voltage comparator circuit 204, are combined, the operation of the voltage comparator circuit 200 operates as follows.

The Low Power Comparator with Adjustable floating ground consists of the previously described Low power voltage comparator 204, the Adjustable floating ground Generator 202, and a switch S2.

Because the (AFG) generator 202 generates the Adjustable floating ground (the node VSS_ADJ), and the low power circuit 206 uses it as local ground, even when the voltages of VDD1 and/or VDD2 relating to the global ground (GND) exceed the breakdown voltage of the devices in the low power circuit 206, it is ensured that these devices won't be damaged.

If voltage of VDD1<voltage of VSS_ADJ<voltage of VDD2, especially when the voltage of VDD1 equals to zero, the switch S2 is open, the first function is to block the path through which the charge passes from node VDD2 and/or node VSS_ADJ to VDD1, the second function is it could undertake proper voltage difference so that to isolate VDD1 voltage when it's extremely low, protecting the other part of the low power circuit 206 from be damaged.

If voltage of VDD2<voltage of VSS_ADJ<voltage of VDD1, the PMOSFET P3 works as a switch, it blocks the path through which the charge passes from node VDD1 and/or node VSS_ADJ to VDD2, and undertakes proper voltage difference so that to isolate VDD2 voltage when it is extremely low, protecting the other part of the low power circuit 206 from be damaged.

These embodiments may be advantageous in that, the voltage comparator 200 may protect all electronic devices from breaking down in all possible conditions or situation with different availability of ambient energy or the operation of the energy harvester, while efficiently switch the output node rapidly so as to promptly switch on or off the charging circuit in response to the highly uncertain availability of ambient energy.

In addition, the voltage comparator 200 may be easily modified so that different kinds or number of energy harvester modules can be included to enhance to ability to harvest more ambient energy available in different applications.

Although not required, the embodiments described with reference to the Figures can be implemented as an application programming interface (API) or as a series of libraries for use by a developer or can be included within another software application, such as a terminal or personal computer operating system or a portable computing device operating system. Generally, as program modules include routines, programs, objects, components and data files assisting in the performance of particular functions, the skilled person will understand that the functionality of the software application may be distributed across a number of routines, objects or components to achieve the same functionality desired herein.

It will also be appreciated that where the methods and systems of the present invention are either wholly implemented by computing system or partly implemented by computing systems then any appropriate computing system architecture may be utilised. This will include tablet computers, wearable devices, smart phones, Internet of Things (IoT) devices, edge computing devices, stand alone computers, network computers, cloud-based computing devices and dedicated hardware devices. Where the terms "computing system" and "computing device" are used, these terms are intended to cover any appropriate arrangement of computer hardware capable of implementing the function described.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

Any reference to prior art contained herein is not to be taken as an admission that the information is common general knowledge, unless otherwise indicated.

The invention claimed is:

1. A voltage comparator circuit for a power source having an energy harvester and an energy storage, comprising:
   a first voltage input node and a second voltage input node arranged to respectively receive a first voltage level, VDD1, of a first output of the energy harvester and a voltage level, VDD2, of a second output of the energy storage;
   an output node, Y, arranged to switch in response to a comparison of VDD1 and VDD2; and
   a plurality of semiconductor junction devices arranged to provide a floating local ground, VSS_LOCAL, arranged to vary in response to a change of the VDD1 and/or VDD2, wherein VSS_LOCAL has a voltage level higher than an absolute ground, GND, connected to the voltage comparator circuit;
   wherein the floating local ground, VSS_LOCAL, is arranged to prevent a breakdown of circuit components due to a voltage difference connected at terminals of each of the circuit component exceeding a breakdown voltage, Vmax, of the respective circuit component.

2. The voltage comparator circuit in accordance with claim 1, wherein VDD2 is lower than or equals to twice of Vmax.

3. The voltage comparator circuit in accordance with claim 1, wherein the plurality of semiconductor junction devices comprises a first set and a second set of junction devices, each of the junction devices has a forward bias voltage drop of a predetermined voltage potential, and wherein VSS_LOCAL is at a node where the first set of junction devices is connected to the second set of junction devices.

4. The voltage comparator circuit in accordance with claim 3, wherein each of the first set and the second set of junction devices includes the same number of junction devices in cascading configuration.

5. The voltage comparator circuit in accordance with claim 4, wherein when VDD1 is high, a continuous current path is provided from VDD1 to GND, passing through sequentially the first set of junction devices, VSS_LOCAL and the second set of junction devices.

6. The voltage comparator circuit in accordance with claim 5, wherein each of the first and the second set of junction devices includes 3 diodes.

7. The voltage comparator circuit in accordance with claim 5, further comprising a first capacitor C1 connected between GND and VSS_LOCAL, wherein the first capacitor C1 is arranged to stabilize VSS_LOCAL.

8. The voltage comparator circuit in accordance with claim 7, further comprising a voltage limiting diode connected between VDD2 and VSS_LOCAL arranged to limit a voltage difference between VSS_LOCAL and VDD2.

9. The voltage comparator circuit in accordance with claim 5, further comprising a second capacitor arranged to pull down the output node Y during the rising edge of VDD1.

10. The voltage comparator circuit in accordance with claim 9, wherein the second capacitor is a capacitor C2 arranged to turn on one or more pull down transistor switches in a current source and mirror stage connected in series with VSS_LOCAL.

11. The voltage comparator circuit in accordance with claim 10, wherein the current source and mirror stage is connected to a local device operation node VDD_LOCAL and the floating local ground VSS_LOCAL, wherein VDD_LOCAL is selectively connected to VDD1 or VSS_LOCAL depending on voltage level of VDD1.

12. The voltage comparator circuit in accordance with claim 11, further comprising a VDD-enabling PMOS arranged to connect VDD_LOCAL to VDD1 when VDD1 is high.

13. The voltage comparator circuit in accordance with claim 12, further comprising a VDD-to-VSS leveling diode arranged to pull VDD_LOCAL to VSS_LOCAL upon the VDD-enabling PMOS isolates the VDD_LOCAL from VDD1.

14. The voltage comparator circuit in accordance with claim 13, further comprising an NMOS arranged to create a bypass from a predetermined number of diodes based on the voltage level of VDD1.

15. The voltage comparator circuit in accordance with claim 9, wherein the second capacitor is a capacitor C3 arranged to decouple a pull up circuit connected in series with VDD2 which are configured to pull up the output node Y when VDD1 is low.

16. The voltage comparator circuit in accordance with claim 15, wherein the pull up circuit comprises a plurality of PMOS connected in series between output node Y and VDD2, and a plurality of capacitors each connected to a gate of the respective PMOS.

17. The voltage comparator circuit in accordance with claim 9, further comprising a pull up diode arranged to pull up the output Y upon VDD1 falls below VSS_LOCAL.

18. The voltage comparator circuit in accordance with claim 4, wherein when VDD1 is low, a continuous current path is provided from VDD2 to GND, passing through sequentially the first set of junction devices, VSS_LOCAL and the second set of junction devices.

19. The voltage comparator circuit in accordance with claim 18, wherein each of the first and the second set of junction devices includes 5 diodes.

20. The voltage comparator circuit in accordance with claim 1, wherein the energy storage is further arranged to energize the voltage comparator circuit.

* * * * *